United States Patent
Sakamoto et al.

(10) Patent No.: US 11,155,684 B2
(45) Date of Patent: Oct. 26, 2021

(54) PHOTOCROSSLINKABLE GROUP-CONTAINING COMPOSITION FOR COATING STEPPED SUBSTRATE

(71) Applicant: NISSAN CHEMICAL INDUSTRIES, LTD., Tokyo (JP)

(72) Inventors: Rikimaru Sakamoto, Toyama (JP); Takafumi Endo, Toyama (JP); Tadashi Hatanaka, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 598 days.

(21) Appl. No.: 15/564,041

(22) PCT Filed: Apr. 1, 2016

(86) PCT No.: PCT/JP2016/060942
§ 371 (c)(1),
(2) Date: Oct. 3, 2017

(87) PCT Pub. No.: WO2016/159358
PCT Pub. Date: Oct. 6, 2016

(65) Prior Publication Data
US 2018/0086886 A1    Mar. 29, 2018

(30) Foreign Application Priority Data

Apr. 3, 2015  (JP) .............................. JP2015-076534

(51) Int. Cl.

| | | |
|---|---|---|
| *C08J 3/24* | (2006.01) | |
| *C09D 163/00* | (2006.01) | |
| *G03F 7/09* | (2006.01) | |
| *G03F 7/038* | (2006.01) | |
| *G03F 7/16* | (2006.01) | |
| *C08F 299/02* | (2006.01) | |
| *G03F 7/11* | (2006.01) | |
| *G03F 7/20* | (2006.01) | |

(52) U.S. Cl.
CPC ............... *C08J 3/24* (2013.01); *C08F 299/02* (2013.01); *C09D 163/00* (2013.01); *G03F 7/038* (2013.01); *G03F 7/094* (2013.01); *G03F 7/11* (2013.01); *G03F 7/168* (2013.01); *G03F 7/20* (2013.01); *C08L 2312/06* (2013.01)

(58) Field of Classification Search
CPC .......... G03F 7/091; G03F 7/094; G03F 7/168; G03F 7/038; G03F 7/20; G03F 7/26; G03F 7/11; C08J 3/24; C08F 299/02; C09D 163/00; C08L 2312/06
USPC ...................................................... 430/271.1
See application file for complete search history.

(56) References Cited

U.S. PATENT DOCUMENTS

| | | | | |
|---|---|---|---|---|
| 5,654,202 A | * | 8/1997 | Daly ..................... | G03F 7/0007 257/E31.121 |
| 5,677,380 A | * | 10/1997 | Matsumura .......... | C09D 133/06 427/340 |
| 6,156,479 A | * | 12/2000 | Meador .................... | C08F 8/00 430/270.1 |
| 2004/0110089 A1 | * | 6/2004 | Neef ....................... | C09B 69/00 430/271.1 |
| 2005/0227168 A1 | * | 10/2005 | Kim ....................... | G03F 7/0035 430/270.1 |

(Continued)

FOREIGN PATENT DOCUMENTS

| | | | | |
|---|---|---|---|---|
| EP | 1879070 A1 | * | 1/2008 | ......... H01L 21/0271 |
| JP | 2004-533637 A | | 11/2004 | |

(Continued)

OTHER PUBLICATIONS

English translation of WO 2015/041208 A obtained from WIPO website with Google translation machine on Mar. 8, 2020, 34 pages. (Year: 2020).*

(Continued)

*Primary Examiner* — Cynthia Hamilton
(74) *Attorney, Agent, or Firm* — Oliff PLC

(57) ABSTRACT

There is provided a composition for coating a stepped substrate that has high filling properties of a pattern, and is capable of forming a coating film that does not cause degassing and heat shrinkage, and is used to form a coating film having flattening properties on the substrate. The composition for coating a stepped substrate includes a compound (C) having in the molecule a partial structure of Formula (1) (where R1 and R2 are each independently a hydrogen atom, a C1-10 alkyl group, or a C6-40 aryl group; five R3s are each independently a hydrogen atom, a hydroxy group, a C1-10 alkoxy group, a C1-10 alkyl group, a nitro group, or a halogen atom; and * is a bond site to the compound); and a solvent.

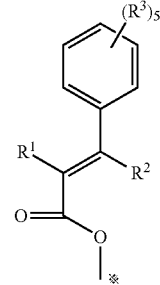

Formula (1)

24 Claims, No Drawings

(56) References Cited

U.S. PATENT DOCUMENTS

2009/0162785 A1* 6/2009 Iwashita .............. C08F 220/26
                                                           430/285.1
2010/0022092 A1* 1/2010 Horiguchi ................ G03F 7/09
                                                           438/706
2011/0132639 A1* 6/2011 Saito ...................... G03F 7/168
                                                           174/250
2013/0285026 A1* 10/2013 Miskiewicz ........ H01L 51/0034
                                                           257/40

FOREIGN PATENT DOCUMENTS

| WO | WO-02083415 A1 * | 10/2002 | ............. G03F 7/091 |
| WO | 2006/115044 A1 | 11/2006 | |
| WO | 2007/066597 A1 | 6/2007 | |
| WO | 2008/047638 A1 | 4/2008 | |
| WO | 2009/008446 A1 | 1/2009 | |
| WO | 2015/041208 A1 | 3/2015 | |

OTHER PUBLICATIONS

Chatani et al "The power of light in polymer science: photochemical processes to manipulate polymer fomration, structure, and properties", Polym. Chem. 2014, vol. 5, pp. 2187-2201 (Royl Society of Chemistry) Published on Dec. 24, 2013. (Year: 2013).*

Jul. 5, 2016 Written Opinion issued in International Patent Application No. PCT/JP2016/060942.

Jul. 5, 2016 Search Report issued in International Patent Application No. PCT/JP2016/060942.

* cited by examiner

PHOTOCROSSLINKABLE GROUP-CONTAINING COMPOSITION FOR COATING STEPPED SUBSTRATE

TECHNICAL FIELD

The present invention relates to a composition for coating a stepped substrate used to form a flattened film on a stepped substrate by photocrosslinking, and a method of producing a laminated substrate that is flattened using the composition for coating a stepped substrate.

BACKGROUND ART

In recent years, a semiconductor integrated circuit device has been processed into a fine design rule. In order to form a finer resist pattern by an optical lithography technique, it is necessary to decrease the wavelength of exposure light.

However, the depth of focus is decreased with the decrease in wavelength of exposure light. Therefore, it is necessary to improve flattening properties of a coating film formed on a substrate. Specifically, a flattening technique for a substrate is important to produce a semiconductor device having a finer design rule.

Conventionally, a method of forming a flattened film, for example, a resist underlayer film that is formed below a resist by light curing has been disclosed.

A resist underlayer film-forming composition containing a polymer having an epoxy group and an oxetane group in a side chain and a photo-cationic polymerization initiator or a resist underlayer film-forming composition containing a polymer having a radical polymerizable ethylenically unsaturated bond and a photo-radical polymerization initiator is disclosed (see Patent Document 1).

A resist underlayer film-forming composition containing a silicon-containing compound having a cationic polymerizable reactive group such as an epoxy group or a vinyl group, a photo-cationic polymerization initiator, and a photo-radical polymerization initiator is disclosed (see Patent Document 2).

A method of producing a semiconductor device using a resist underlayer film containing a polymer having a crosslinkable functional group (e.g., hydroxy group) in a side chain, a crosslinker, and a photoacid generator is disclosed (see Patent Document 3).

A resist underlayer film having an unsaturated bond in a main or side chain, which is not a photocrosslinkable resist underlayer film, is disclosed (see Patent Documents 4 and 5).

PRIOR ART DOCUMENTS

Patent Documents

Patent Document 1: International publication WO2006/115044
Patent Document 2: International publication WO2007/066597
Patent Document 3: International publication WO2008/047638
Patent Document 4: International publication WO2009/008446
Patent Document 5: Japanese Patent Application Publication No. 2004-533637 (JP 2004-533637 A)

SUMMARY OF THE INVENTION

Problem to be Solved by the Invention

When a conventional photocrosslinking material, for example, a resist underlayer film-forming composition containing a polymer having a thermal crosslinking-forming functional group such as a hydroxy group, a crosslinker, and an acid catalyst (acid generator) is heated to fill a pattern (e.g., a hole or a trench structure) formed on a substrate, a crosslinking reaction proceeds, and the viscosity increases. As a result, there is a problem of insufficient filling properties of the pattern. Further, heat shrinkage due to degassing occurs. Therefore, there is a problem of unfavorable flattening properties.

For a resist underlayer film-forming composition containing a polymer having a cationic polymerizable reactive group such as an epoxy group or a vinyl group and an acid generator, light irradiation and heating are carried out. In this case, heat shrinkage due to degassing also occurs. Therefore, there is the problem of unfavorable flattening properties.

The present invention provides a composition for coating a stepped substrate that has high filling properties of a pattern, and is capable of forming a coating film that does not cause degassing and heat shrinkage, and is used to form a coating film having flattening properties on the substrate.

Means for Solving the Problems

As a first aspect, the present invention is a composition for coating a stepped substrate comprising a compound (C) having in the molecule a partial structure of Formula (1):

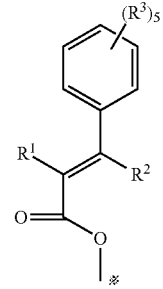

Formula (1)

(wherein $R^1$ and $R^2$ are each independently a hydrogen atom, a $C_{1-10}$ alkyl group, or a $C_{6-40}$ aryl group, five $R^3$s are each independently a hydrogen atom, a hydroxy group, a $C_{1-10}$ alkoxy group, a $C_{1-10}$ alkyl group, a nitro group, or a halogen atom, and * is a bond site to the compound), and a solvent.

As a second aspect, the present invention is the composition for coating a stepped substrate according to the first aspect, wherein the compound (C) is a reaction product of an epoxy group-containing compound (A) and cinnamic acid (B) having the partial structure of Formula (1).

As a third aspect, the present invention is the composition for coating a stepped substrate according to the second aspect, wherein the compound (C) is the reaction product in which the mole ratio of an epoxy group of the epoxy group-containing compound (A) to the cinnamic acid (B) having the partial structure of Formula (1) is 1:1 to 4:1.

As a fourth aspect, the present invention is the composition for coating a stepped substrate according to the second or third aspect, wherein the epoxy group-containing compound (A) is an epoxy group-containing benzene or epoxy group-containing benzene fused ring compound, an epoxy group-containing aliphatic polyether, an epoxy group-containing novolak polymer, a polyether of epoxy group-containing alicyclic hydrocarbon, or an epoxy group-containing polyester.

As a fifth aspect, the present invention is the composition for coating a stepped substrate according to any one of the first to fourth aspects, which is a composition used as a resist underlayer film-forming composition in a lithography process for production of a semiconductor device.

As a sixth aspect, the present invention is a method of producing a coated substrate comprising steps of (i) applying the composition for coating a stepped substrate according to any one of the first to fifth aspects to a stepped substrate, and (ii) exposing the coated substrate.

As a seventh aspect, the present invention is the method according to the sixth aspect, wherein the step (i) further includes a step (ia) of heating the coated substrate at a temperature of 70 to 400° C. for 10 seconds to 5 minutes after applying the composition for coating a stepped substrate to the substrate.

As an eighth aspect, the present invention is the method according to the sixth or seventh aspect, wherein exposure light in the step (ii) has a wavelength of 250 nm to 350 nm.

As a ninth aspect, the present invention is the method according to any one of the sixth to eighth aspects, wherein the exposure dose in the step (ii) is 500 mJ/cm$^2$ to 1,500 mJ/cm$^2$.

As a tenth aspect, the present invention is the method according to any one of the sixth to ninth aspects, wherein the stepped substrate has an open area (unpatterned area) and a pattern area of DENSE (dense) and ISO (coarse), and the aspect ratio of the pattern is 0.1 to 10.

As an eleventh aspect, the present invention is the method according to any one of the sixth to tenth aspects, wherein the coated substrate to be produced has a bias (difference in level of coating) between the open area and the pattern area of 1 to 50 nm.

As a twelfth aspect, the present invention is a method of producing a semiconductor device comprising steps of forming an underlayer film on a stepped substrate from the composition for coating a stepped substrate according to any one of the first to fifth aspects, forming a resist film on the underlayer film, forming a resist pattern by irradiation with light or an electron beam and development, etching the underlayer film through the formed resist pattern, and processing a semiconductor substrate using the patterned underlayer film.

As a thirteenth aspect, the present invention is the method according to the twelfth aspect, wherein the stepped substrate has an open area (unpatterned area) and a pattern area of DENSE (dense) and ISO (coarse), and the aspect ratio of the pattern is 0.1 to 10.

As a fourteenth aspect, the present invention is the method according to the twelfth or thirteenth aspect, wherein the step of forming an underlayer film from the composition for coating a stepped substrate includes steps of (i) applying the composition for coating a stepped substrate according to any one of the first to fifth aspects to the stepped substrate, and (ii) exposing the coated substrate.

As a fifteenth aspect, the present invention is the method according to the fourteenth aspect, wherein the step (i) further includes a step (ia) of heating the coated substrate at a temperature of 70 to 400° C. for 10 seconds to 5 minutes after applying the composition for coating a stepped substrate to the substrate.

As a sixteenth aspect, the present invention is the method according to the fourteenth or fifteenth aspect, wherein exposure light in the step (ii) has a wavelength of 250 nm to 350 nm.

As a seventeenth aspect, the present invention is the method according to any one of the fourteenth to sixteenth aspects, wherein the exposure dose in the step (ii) is 500 mJ/cm$^2$ to 1,500 mJ/cm$^2$.

As an eighteenth aspect, the present invention is the method according to the twelfth to seventeenth aspects, wherein the underlayer film formed from the composition for coating a stepped substrate has a difference in level of coating as a bias between the open area and the pattern area of 1 to 50 nm.

As a nineteenth aspect, the present invention is a method of producing a semiconductor device comprising steps of forming an underlayer film on a stepped substrate from the composition for coating a stepped substrate according to any one of the first to fifth aspects, forming a hard mask on the underlayer film, forming a resist film on the hard mask, forming a resist pattern by irradiation with light or an electron beam and development, etching the hard mask through the formed resist pattern, etching the underlayer film through the patterned hard mask, and processing a semiconductor substrate through the patterned underlayer film.

As a twentieth aspect, the present invention is the method according to the nineteenth aspect, wherein the stepped substrate has an open area (unpatterned area) and a pattern area of DENSE (dense) and ISO (coarse) and the aspect ratio of the pattern is 0.1 to 10.

As a twenty-first aspect, the present invention is the method according to the nineteenth or twentieth aspect, wherein the step of forming an underlayer film from the composition for coating a stepped substrate includes steps of (i) applying the composition for coating a stepped substrate according to any one of the first to fifth aspects to the stepped substrate and (ii) exposing the coated substrate.

As a twenty-second aspect, the present invention is the method according to the twenty-first aspect, wherein the step (i) further includes a step (ia) of heating the coated substrate at a temperature of 70 to 400° C. for 10 seconds to 5 minutes after applying the composition for coating a stepped substrate to the substrate.

As a twenty-third aspect, the present invention is the method according to the twenty-first or twenty-second aspect, wherein exposure light in the step (ii) has a wavelength of 250 nm to 350 nm.

As a twenty-fourth aspect, the present invention is the method according to any one of the twenty-first to twenty-third aspects, wherein the exposure dose in the step (ii) is 500 mJ/cm$^2$ to 1,500 mJ/cm$^2$.

As a twenty-fifth aspect, the present invention is the method according to the nineteenth to twenty-fourth aspects, wherein the underlayer film formed from the composition for coating a stepped substrate has a difference in level of coating as a bias between the open area and the pattern area of 1 to 50 nm.

Effects of the Invention

When the stepped substrate composition of the present invention is applied to a substrate or in any case, reflowed by further heating, a pattern is filled with the composition. In this case, the stepped substrate composition of the present invention allows a flat film to be formed regardless of an open area (unpatterned area) and a pattern area of DENSE (dense) and ISO (coarse) on the substrate in a step. This is because the stepped substrate composition does not have a thermal crosslinking moiety and an acid catalyst, and therefore the viscosity of the composition does not increase in the step. In the stepped substrate composition of the present invention, a cyclobutane ring is formed by a photoreaction of unsaturated bonds derived from cinnamic acid contained as a component, and a crosslinking structure is formed in a film. Specifically, a stepped substrate-coating film (flattened film) formed by applying the composition for coating a stepped substrate of the present invention, which does not contain a crosslinker and an acid catalyst, is obtained by crosslinking a cyclobutane ring to be formed by a photodimerization of double bonds derived from cinnamic acid.

Therefore, in formation of the stepped substrate-coating film (flattened film) from the composition for coating a stepped substrate of the present invention, a crosslinking reaction of a crosslinker with an acid catalyst does not occur during thermal reflow, and heat shrinkage does not occur due to the photodimerization without degassing as subsequent photocrosslinking. According to the composition for coating a stepped substrate of the present invention, both filling properties of a pattern and flattening properties after filling are achieved, and an excellent flattened film can be formed.

MODES FOR CARRYING OUT THE INVENTION

The present invention is a composition for coating a stepped substrate containing a compound (C) having a partial structure of Formula (1) in the molecule and a solvent.

In Formula (1), $R^1$ and $R^2$ are each respectively a hydrogen atom, a $C_{1-10}$ alkyl group, or a $C_{6-40}$ aryl group, $R^3$s are each independently a hydrogen atom, a hydroxy group, a $C_{1-10}$ alkoxy group, a $C_{1-10}$ alkyl group, a nitro group, or a halogen atom, and * is a bond site to the compound.

The composition for coating a stepped substrate may contain an additive such as a surfactant, if necessary.

The solid content of the composition is 0.1 to 70% by mass, 0.1 to 60% by mass, 0.2 to 30% by mass, or 0.3 to 15% by mass. The solid content is a content ratio of all components other than the solvent in the composition for coating a stepped substrate. The solid content may contain the compound (C) in an amount of 1 to 100% by mass, 1 to 99.9% by mass, 50 to 99.9% by mass, 50 to 95% by mass, or 50 to 90% by mass.

The compound (C) used in the present invention has an average molecular weight of 600 to 1,000,000, 600 to 200,000, or 1,500 to 15,000.

Since the compound (C) has the partial structure of Formula (1) in the molecule, a photodimerization of unsaturated double bonds occurs in or between the molecules, to form a cyclobutane ring. As a result, a crosslinking structure can be formed. Herein, the compound (C) may also have at least two partial structures of Formula (1) in the molecule, or a plurality of partial structures (e.g., one to several tens) in the molecule.

Examples of the $C_{1-10}$ alkyl group include methyl group, ethyl group, n-propyl group, i-propyl group, cyclopropyl group, n-butyl group, i-butyl group, sec-butyl group, tert-butyl group, cyclobutyl group, 1-methyl-cyclopropyl group, 2-methyl-cyclopropyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, cyclopentyl group, 1-methyl-cyclobutyl group, 2-methyl-cyclobutyl group, 3-methyl-cyclobutyl group, 1,2-dimethyl-cyclopropyl group, 2,3-dimethyl-cyclopropyl group, 1-ethyl-cyclopropyl group, 2-ethyl-cyclopropyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, cyclohexyl group, 1-methyl-cyclopentyl group, 2-methyl-cyclopentyl group, 3-methyl-cyclopentyl group, 1-ethyl-cyclobutyl group, 2-ethyl-cyclobutyl group, 3-ethyl-cyclobutyl group, 1,2-dimethyl-cyclobutyl group, 1,3-dimethyl-cyclobutyl group, 2,2-dimethyl-cyclobutyl group, 2,3-dimethyl-cyclobutyl group, 2,4-dimethyl-cyclobutyl group, 3,3-dimethyl-cyclobutyl group, 1-n-propyl-cyclopropyl group, 2-n-propyl-cyclopropyl group, 1-i-propyl-cyclopropyl group, 2-i-propyl-cyclopropyl group, 1,2,2-trimethyl-cyclopropyl group, 1,2,3-trimethyl-cyclopropyl group, 2,2,3-trimethyl-cyclopropyl group, 1-ethyl-2-methyl-cyclopropyl group, 2-ethyl-1-methyl-cyclopropyl group, 2-ethyl-2-methyl-cyclopropyl group, and 2-ethyl-3-methyl-cyclopropyl group.

Examples of the $C_{6-40}$ aryl group include phenyl group, biphenyl group, terphenylene group, fluorene group, naphthyl group, anthryl group, pyrene group, and carbazole group.

Examples of the $C_{1-10}$ alkoxy group include methoxy group, ethoxy group, n-propoxy group, i-propoxy group, n-butoxy group, i-butoxy group, s-butoxy group, tert-butoxy group, n-pentoxy group, 1-methyl-n-butoxy group, 2-methyl-n-butoxy group, 3-methyl-n-butoxy group, 1,1-dimethyl-n-propoxy group, 1,2-dimethyl-n-propoxy group, 2,2-dimethyl-n-propoxy group, 1-ethyl-n-propoxy group, n-hexyloxy group, 1-methyl-n-pentyloxy group, 2-methyl-n-pentyloxy group, 3-methyl-n-pentyloxy group, 4-methyl-n-pentyloxy group, 1,1-dimethyl-n-butoxy group, 1,2-dimethyl-n-butoxy group, 1,3-dimethyl-n-butoxy group, 2,2-dimethyl-n-butoxy group, 2,3-dimethyl-n-butoxy group, 3,3-dimethyl-n-butoxy group, 1-ethyl-n-butoxy group, 2-ethyl-n-butoxy group, 1,1,2-trimethyl-n-propoxy group, 1,2,2-trimethyl-n-propoxy group, 1-ethyl-1-methyl-n-propoxy group, and 1-ethyl-2-methyl-n-propoxy group.

Examples of the halogen atom include a fluorine atom, a chlorine atom, a bromine atom, and an iodine atom.

The compound (C) can be synthesized by a reaction of an epoxy group-containing compound (A) with cinnamic acid (B) having the partial structure of Formula (1). The compound (C) can be used as a low molecule or polymer depending on the form of the epoxy group-containing compound (A).

In the reaction, the epoxy group-containing compound (A) and the cinnamic acid (B) having the partial structure of Formula (1) are refluxed for 1 to 30 hours under a nitrogen atmosphere in the presence of a catalyst (e.g., ethyltriphenylphosphonium bromide and benzyltriethylammonium chloride) and a solvent (e.g., propylene glycol monomethyl ether and propylene glycol monomethyl ether acetate). Thus, the compound (C) can be obtained. In order to inhibit polymerization of unsaturated double bonds that is caused in the reaction, a polymerization inhibitor (e.g., hydroquinone) can be further used.

In the aforementioned method, the reaction can be carried out at a mole ratio of an epoxy group of the epoxy group-containing compound (A) to the cinnamic acid (B) having the partial structure of Formula (1) of 1:1 to 4:1, 1:1 to 2:1, or 1:1 to 1.5:1. It is preferable that the reaction be carried out at a mole ratio of the epoxy group of the epoxy group-containing compound (A) to the cinnamic acid (B) having the partial structure of Formula (1) of 1:1 to obtain the compound (C) in which all the epoxy group is converted into a cinnamic acid derivative having an unit structure of Formula (1).

Examples of the epoxy group-containing compound (A) used in the present invention include an epoxy group-containing benzene or epoxy group-containing benzene fused ring compound, an epoxy group-containing aliphatic polyether, an epoxy group-containing novolak polymer, a polyether of epoxy group-containing alicyclic hydrocarbon, and an epoxy group-containing polyester. They are available as a commercial product, and examples thereof include as follows.

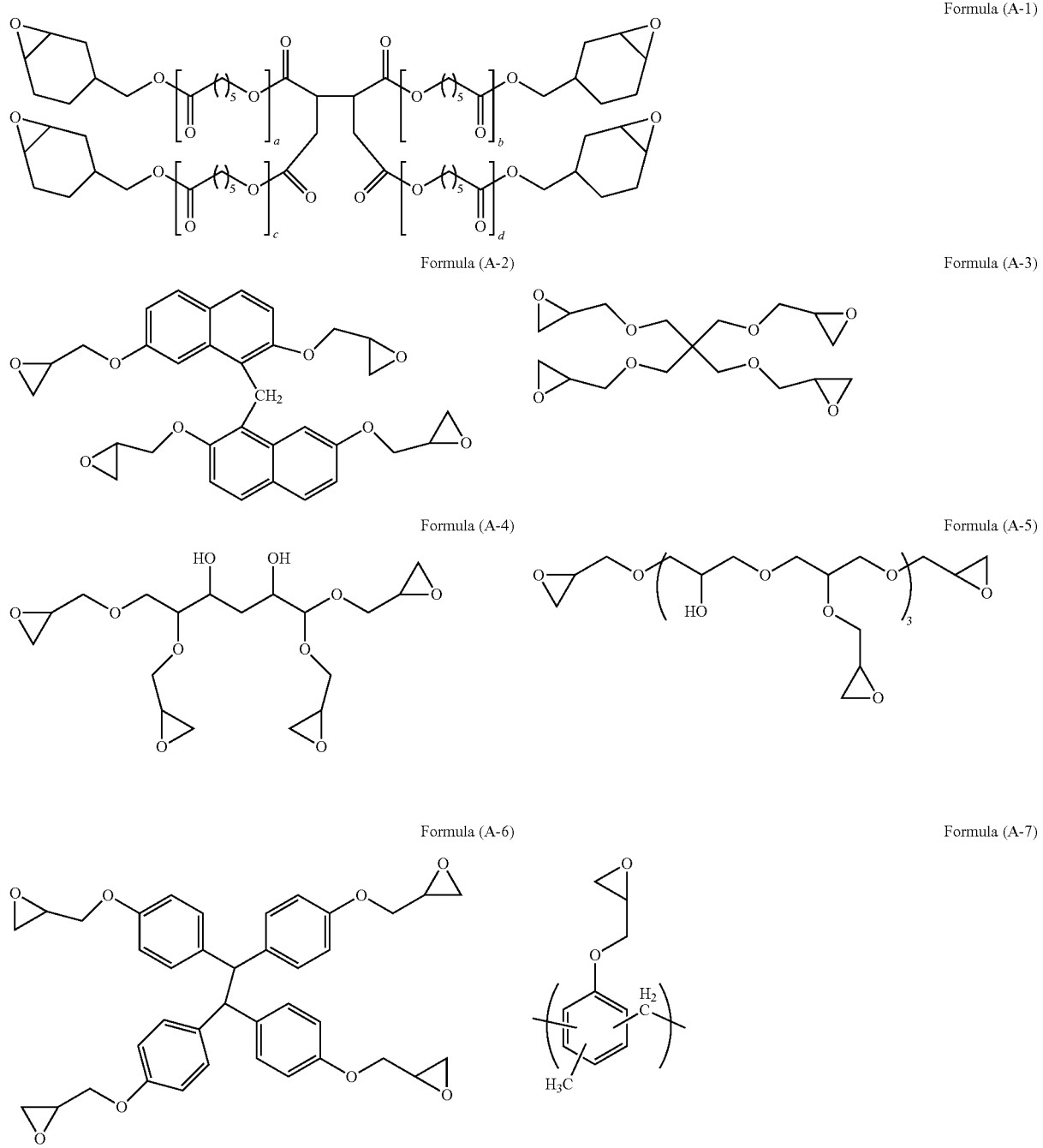

-continued

Formula (A-8)

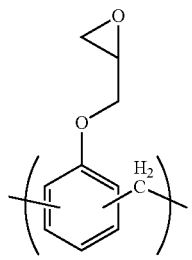

Formula (A-9)

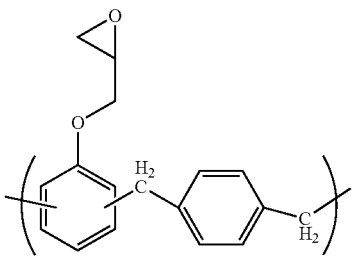

Formula (A-10)

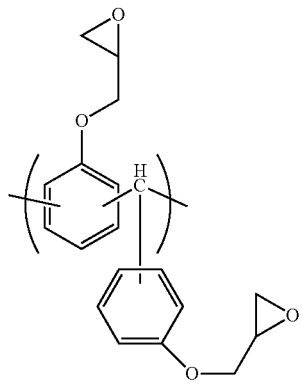

Formula (A-11)

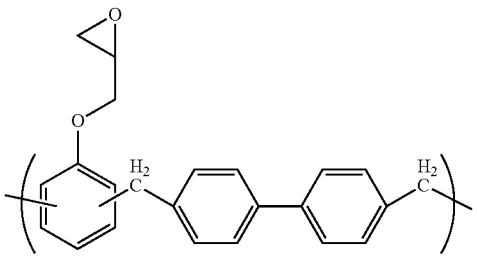

Formula (A-12)

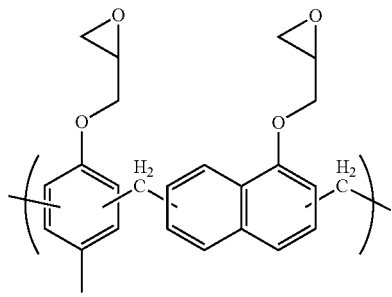

Formula (A-13)

Formula (A-14)

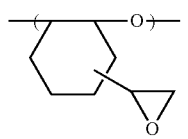

Formula (A-1) can be obtained as trade name GT401 available from Daicel Corporation. In Formula (A-1), a, b, c, and d are each 0 or 1, and a+b+c+d is 1.

Formula (A-2) can be obtained as trade name HP-4700 available from DIC Corporation.

Formula (A-3) can be obtained as trade name EX-411 available from Nagase ChemteX Corporation.

Formula (A-4) can be obtained as trade name EX-611 available from Nagase ChemteX Corporation.

Formula (A-5) can be obtained as trade name EX-521 available from Nagase ChemteX Corporation.

Formula (A-6) can be obtained as trade name TEP-G available from Asahi Organic Chemicals Industry Co., Ltd.

Formula (A-7) can be obtained as trade name ECN-1229 available from Asahi Kasei Epoxy Co., Ltd.

Formula (A-8) can be obtained as trade name EPPN-201 available from NIPPON KAYAKU Co., Ltd.

Formula (A-9) can be obtained as trade name NC-2000L available from NIPPON KAYAKU Co., Ltd.

Formula (A-10) can be obtained as trade name EPPN-501H available from NIPPON KAYAKU Co., Ltd.

Formula (A-11) can be obtained as trade name NC-3000L available from NIPPON KAYAKU Co., Ltd.

Formula (A-12) can be obtained as trade name NC-7000L available from NIPPON KAYAKU Co., Ltd.

Formula (A-13) can be obtained as trade name NC-7300L available from NIPPON KAYAKU Co., Ltd.

Formula (A-14) can be obtained as trade name EHPE-3150 available from Daicel Corporation.

For example, another epoxy resin can be obtained as trade name EPICLONHP-5000, EPICLON HP-6000, or EPICLON HP-7200H available from DIC Corporation.

Examples of the cinnamic acid (B) having the partial structure of Formula (1) used in the present invention include the following compounds. The compounds are available as reagents.

Formula (B-1) through Formula (B-12) show various cinnamic acid derivatives.

Examples of the compound (C) having at least two partial structures of

Formula (1) in the molecule used in the present invention include as follows.

Formula (C-1)

Formula (C-2)

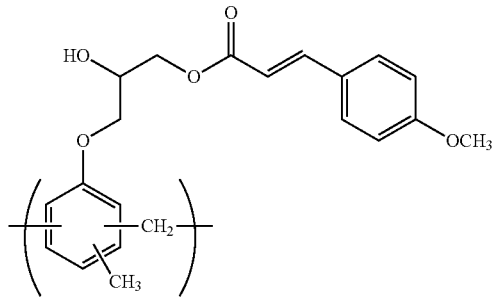

Formula (C-3)

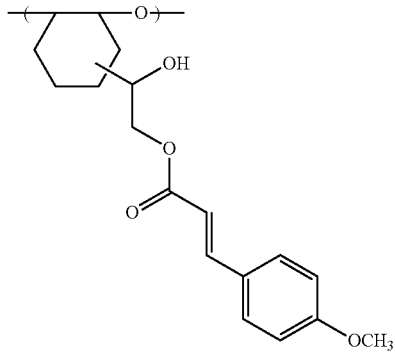

The composition for coating a stepped substrate of the present invention can contain a surfactant. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorosurfactants including Eftop (registered trademark) EF301, EF303, and EF352 (available from Mitsubishi Materials Electronic Chemicals Co., Ltd.), MEGAFACE (registered trademark) F171, F173, R30, R-30N, and R-40LM (available from DIC Corporation), Fluorad FC430 and FC431 (available from Sumitomo 3M, Ltd.), AsahiGuard (registered trademark) AG710, and Surflon (registered trademark) S-382, SC101, SC102, SC103, SC104, SC105, and SC106 (available from Asahi Glass Co., Ltd.), and organosiloxane polymer KP341 (available from Shin-Etsu Chemical Co., Ltd.). One type selected from the surfactants may be added or two or more types thereof may be added in combination. The content of the surfactant is, for example, 0.01% by mass to 5% by mass relative to the solid content of the composition for coating a stepped substrate of the present invention except for the solvent described blow.

As a solvent capable of dissolving the compound (C) in the present invention, ethylene glycol monomethyl ether, ethylene glycol monoethyl ether, ethylene glycol monobutyl ether, ethylene glycol monoisopropyl ether, ethylene glycol methyl ether acetate, ethylene glycol ethyl ether acetate, methyl cellosolve acetate, ethyl cellosolve acetate, diethylene glycol, diethylene glycol monomethyl ether, diethylene glycol monoethyl ether, diethylene glycol dimethyl ether, diethylene glycol diethyl ether, diethylene glycol monoethyl ether acetate, propylene glycol, propylene glycol monomethyl ether, propylene glycol monobutyl ether, propylene glycol monomethyl ether acetate, propylene glycol monoethyl ether, propylene glycol monoethyl ether acetate, propylene glycol propyl ether acetate, dipropylene glycol monomethyl ether, dipropylene glycol monoethyl ether, triethylene glycol dimethyl ether, toluene, xylene, styrene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropinoate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 1-octanol, ethylene glycol, hexylene glycol, trimethylene glycol, 1-methoxy-2-buthanol, cyclohexanol, diacetone alcohol, furfuryl alcohol, tetrahydrofurfuryl alcohol, benzyl alcohol, 1,3-butanediol, 1,4-butanediol, 2,3-butanediol, γ-butyrolactone, acetone, methyl isopropyl ketone, diethyl ketone, methyl isobutyl ketone, methyl n-butyl ketone, isopropyl acetate ketone, n-propyl acetate, isobutyl acetate, methanol, ethanol, isopropanol, tert-butanol, allyl alcohol, n-propanol, 2-methyl-1-butanol, isobutanol, n-butanol, 2-methyl-1-butanol, 1-pentanol, 2-methyl-1-pentanol, 2-ethyl hexanol, isopropyl ether, 1,4-dioxane, N,N-dimethyl paternmuamide, N,N-dimethylacetamide, N-methylpyrrolidone, 1,3-dimethyl-2-imidazolidinone, dimethyl sulfoxide, N-cyclohexyl-2-pyrrolidinone, or the like can be used. The organic solvent can be used alone, or two or more types thereof can be used in combination.

Next, a method of forming a flattened film using the composition for coating a stepped substrate of the present invention will be described. The composition for coating a stepped substrate is applied to a substrate used in production of a precision integrated circuit element (e.g., a transparent substrate such as a silicon/silicon dioxide coating, a glass substrate, and an ITO substrate) by an appropriate coating method using a spinner or a coater, preferably followed by baking (heating). The composition is then exposed to form a coating film. Specifically, a coated substrate is produced by a method including a step (i) of applying the composition for coating a stepped substrate of the present invention to a stepped substrate, and a step (ii) of exposing the substrate to be applied.

When a spinner is used for coating, for example, the coating can be carried out under conditions of revolution speed of 100 to 5,000 for 10 to 180 seconds.

As the substrate, a substrate having an open area (unpatterned area) and a pattern area of DENSE (dense) and ISO (coarse) of which the aspect ratio is 0.1 to 10 can be used.

The unpatterned area represents a portion where there is no pattern (e.g., a hole or a trench structure) on the substrate. On the substrate, DENSE (dense) represents a portion which is dense with patterns, and ISO (coarse) represents a portion where a distance between the patterns is long and the patterns are scattered. The aspect ratio of the pattern is a ratio of the depth of the pattern to the width of the pattern. The pattern depth is usually several hundreds nm (e.g., about 100 to 300 nm). DENSE (dense) is a portion where the patterns of several tens nm (e.g., 30 to 80 nm) are densely disposed at intervals of about 100 nm. ISO (coarse) is a portion where the patterns of several hundreds nm (e.g., about 200 to 1,000 nm) are scattered.

Herein, the thickness of the stepped substrate-coating film (flattened film) is preferably 0.01 to 3.0 μm. After the step (i), the method may include a step (ia) of heating the coated substrate after the coating. The heating condition includes at 70 to 400° C. or 100 to 250° C. for 10 seconds to 5 minutes or 30 seconds to 2 minutes. Due to the heating, the composition for coating a stepped substrate is reflowed to form a flat stepped substrate-coating film (flattened film).

The exposure light in the step (ii) is actinic radiation such as near ultraviolet light, far ultraviolet light, or extreme ultraviolet light (e.g., EUV, wavelength: 13.5 nm). For example, light having a wavelength of 248 nm (KrF laser beam), 193 nm (ArF laser beam), or 157 nm ($F_2$ laser beam) can be used. Ultraviolet light having a wavelength of 250 nm to 350 nm as a wavelength of the exposure light can be used. Ultraviolet light having a wavelength of 313 nm or 320 nm can be preferably used.

By the exposure, crosslinking of the stepped substrate-coating film (flattened film) is carried out. The exposure dose in the step (ii) may be 500 mJ/$cm^2$ to 1,500 mJ/$cm^2$. When the exposure dose falls within this range, the compound (C) is subjected to photodimerization to form crosslinking, and solvent resistance is caused.

In the stepped substrate-coating film (flattened film) thus formed, it is desirable that the bias (difference in level of coating) between the open area and the pattern area be 0. The stepped substrate-coating film can be flattened so that the bias falls within a range 1 to 50 nm or 1 to 25 nm. The bias between the open area and the area of DENSE is about 15 to 20 nm, and the bias between the open area and the area of ISO is about 1 to 10 nm.

The stepped substrate-coating film (flattened film) obtained by the present invention is coated with a resist film, the resist film is exposed and developed by lithography, to form a resist pattern, and the substrate can be processed through the resist pattern. In this case, the stepped substrate-coating film (flattened film) is a resist underlayer film, that is, the composition for coating a stepped substrate is a resist underlayer film-forming composition for lithography. By the resist underlayer film-forming composition according to the present invention, the resist underlayer film can be formed through the steps (i) and (ii) and the step (ia), for example, under the conditions of heating after the coating, exposure light, and exposure dose described above, and the resist underlayer film having the same bias (difference in level of coating) can be formed.

Subsequently, a resist is applied to the formed resist underlayer film, irradiated with light or an electron beam through a predetermined mask, developed, rinsed, and dried. Thus, a good resist pattern can be obtained. If necessary, post exposure bake (PEB) can be also carried out after irradiation with light or an electron beam. The resist underlayer film at a portion where the resist is developed and removed in the step described above can be removed by dry etching, to form a desired pattern on the substrate.

The exposure light of the photoresist is actinic radiation such as near ultraviolet light, far ultraviolet light, or extreme ultraviolet light (e.g., EUV, wavelength: 13.5 nm). For example, light having a wavelength of 248 nm (KrF laser beam), 193 nm (ArF laser beam), or 157 nm ($F_2$ laser beam) can be used. A method for light irradiation can be adopted without particular restriction as long as it is a method capable of generating an acid from a photoacid generator in the resist. The exposure dose is 1 to 2,000 mJ/$cm^2$, 10 to 1,500 mJ/$cm^2$, or 50 to 1,000 mJ/$cm^2$.

In irradiation of an electron beam of resist with electron beam, for example, an electron beam irradiation device can be used for irradiation.

As a developer solution for the resist on the resist underlayer film formed using the resist underlayer film-forming composition for lithography according to the present invention, an aqueous solution of alkali including inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine can be used. A solution in which proper amounts of an alcohol such as isopropyl alcohol and a surfactant such as a nonionic surfactant are added to the aqueous solution of the alkali can be used. Among the developers, a quaternary ammonium salt is preferred, and tetramethylammonium hydroxide and choline are further preferred.

As the developer, an organic solvent may be used. Examples thereof include methyl acetate, butyl acetate, ethyl acetate, isopropyl acetate, amyl acetate, isoamyl acetate, ethyl methoxyacetate, ethyl ethoxyacetate, propylene glycol monomethyl ether, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-2-hydroxypropionate, ethyl-2-hydroxypropionate, methyl-3-methoxypropionate, ethyl-3-methoxypropionate, ethyl-3-ethoxypropionate, and propyl-3-methoxypropionate. Further, a surfactant or the like can be added to the developer. A development condition is appropriately selected from a temperature of 5 to 50° C. and a time of 10 to 600 seconds.

In the present invention, a semiconductor device can be produced through steps of forming a resist underlayer film on a semiconductor substrate from the resist underlayer film-forming composition (composition for coating a stepped substrate) of the present invention, forming a resist film on the resist underlayer film, forming a resist pattern by irradiation with light or an electron beam and development, etching the resist underlayer film through the formed resist pattern, and processing the semiconductor substrate through the patterned resist underlayer film.

When formation of finer resist pattern further proceeds, a problem of resolution and a problem in which the resist pattern collapses after development occur. Therefore, a decrease in film thickness of the resist is desired. In this case, it is difficult to obtain a resist pattern film thickness sufficient for substrate processing. A process of imparting a function of a mask during substrate processing to not only the resist pattern but also the resist underlayer film that is formed between the resist and the semiconductor substrate to be processed is required. As a resist underlayer film for such processing, a resist underlayer film for lithography having a selection ratio of dry etching rate close to that of the resist, which is different from a conventional resist underlayer film having a high etching rate, a resist underlayer film for lithography having a smaller selection ratio of dry etching rate than that of the resist, and a resist underlayer film for lithography having a smaller selection ratio of dry etching rate than that of the semiconductor substrate are required. To such a resist underlayer film, an anti-reflective performance may be imparted, or the resist underlayer film may have a function of a conventional anti-reflective coating.

On the other hand, in order to obtain a finer resist pattern, a process of making the resist pattern and the resist underlayer film finer than the pattern width during resist development by dry etching of the resist underlayer film begins to be used. A resist underlayer film having a selection ratio of dry etching rate close to that of the resist, which is different from the conventional anti-reflective coating having a high etching rate is required as the resist underlayer film for such a process. To such a resist underlayer film, an anti-reflective performance may be imparted, or the resist underlayer film may have a function of the conventional anti-reflective coating.

In the present invention, the resist underlayer film of the present invention is formed on the substrate, and the resist may be applied directly to the resist underlayer film, or if necessary, the resist may be applied after one or more layers of coating material are formed on the resist underlayer film. In this case, even when the resist is thinly applied to prevent pattern collapse due to a decrease in pattern width of the resist, the substrate can be processed by selection of appropriate etching gas.

Specifically, the semiconductor device can be produced through steps of forming a resist underlayer film on a semiconductor substrate from the resist underlayer film-forming composition of the present invention (composition for coating a stepped substrate), forming a hard mask from a coating material containing a silicon component or the like or a hard mask (e.g., from silicon nitride oxide) by vapor deposition on the resist underlayer film, forming a resist film on the hard mask, forming a resist pattern by irradiation with light or an electron beam and development, etching the hard mask through the resist pattern by halogen-based gas, etching the resist underlayer film through the patterned hard mask by oxygen-based gas or hydrogen-based gas, and processing the semiconductor substrate through the patterned resist underlayer film by halogen-based gas.

In consideration of effects as the anti-reflective coating, a light absorption portion is incorporated in a skeleton of the resist underlayer film-forming composition for lithography according to the present invention. Therefore, a substance is not diffused in the photoresist during heating and drying, and the light absorption portion has sufficiently large light absorption performance. Accordingly, the resist underlayer film-forming composition has a high reflective light prevention effect.

The resist underlayer film-forming composition for lithography according to the present invention has high thermal stability, and can prevent pollution of an upper-layer film due to a decomposed substance during baking, and provide a temperature margin in a baking step.

The resist underlayer film-forming composition for lithography according to the present invention can be used as a film having a function of preventing reflection of light depending on a process condition, and a function of preventing an interaction between the substrate and the photoresist or an adverse influence on the substrate of a substance produced during exposure of a material used for the photoresist or the photoresist to light.

EXAMPLES

Synthesis Example 1

37.44 g of propylene glycol monomethyl ether was added to 7.50 g of epoxy group-containing benzene fused ring compound EPICLON HP-4700 (trade name, epoxy value: 165 g/eq., available from DIC Corporation, Formula (A-2)), 8.10 g of 4-methoxycinnamic acid, 0.42 g of ethyltriphenylphosphonium bromide, and 0.03 g of hydroquinone, and the mixture was heated and refluxed under a nitrogen atmosphere for 17 hours. To the obtained polymer solution, 16 g of cation exchange resin (trade name: DOWEX (registered trademark) 550A, Muromachi Technos Co., Ltd.) and 16 g of anion exchange resin (trade name: amberlite (registered trademark) 15JWET, ORGANO CORPORATION) were added, and the mixture was subjected to ion exchange treatment at room temperature for 4 hours. The ion-exchange resins were separated, and a solution of compound (C) was obtained. The obtained compound (C) corresponded to Formula (C-1), and the weight average molecular weight Mw measured by GPC in terms of polystyrene was 1,700.

Synthesis Example 2

32.61 g of propylene glycol monomethyl ether was added to 7.50 g of epoxy group-containing novolak polymer ECN1229 (trade name, epoxy value: 218 g/eq., available from Asahi Kasei Epoxy Co., Ltd, Formula (A-7)), 6.14 g of 4-methoxycinnamic acid, 0.32 g of ethyltriphenylphosphonium bromide, and 0.02 g of hydroquinone, and the mixture was heated and refluxed under a nitrogen atmosphere for 13 hours. To the obtained polymer solution, 14 g of cation exchange resin (trade name: DOWEX (registered trademark) 550A, Muromachi Technos Co., Ltd.) and 14 g of anion exchange resin (trade name: amberlite (registered trademark) 15JWET, ORGANO CORPORATION) were added, and the mixture was subjected to ion exchange treatment at room temperature for 4 hours. The ion-exchange resins were separated, and a solution of compound (C) was obtained. The obtained compound (C) corresponded to Formula (C-2), and the weight average molecular weight Mw measured by GPC in terms of polystyrene was 6,000.

Synthesis Example 3

7.56 g of propylene glycol monomethyl ether and 17.65 g of propylene glycol monomethyl ether acetate were added to 5.00 g of polyether of epoxy group-containing alicyclic hydrocarbon EHPE-3150 (trade name, epoxy value: 173 g/eq., available from Daicel Corporation, Formula (A-14)), 5.15 g of 4-methoxycinnamic acid, 0.64 g of ethyltriphenylphosphonium bromide, and 0.02 g of hydroquinone, and the mixture was heated and refluxed under a nitrogen atmosphere for 13 hours. To the obtained polymer solution, 19 g of cation exchange resin (trade name: DOWEX (registered trademark) 550A, Muromachi Technos Co., Ltd.) and 19 g of anion exchange resin (trade name: amberlite (registered trademark) 15JWET, ORGANO CORPORATION) were added, and the mixture was subjected to ion exchange treatment at room temperature for 4 hours. The ion-exchange resins were separated, and a solution of compound (C) was obtained. The obtained compound (C) corresponded to Formula (C-3), and the weight average molecular weight Mw measured by GPC in terms of polystyrene was 4,200.

Comparative Synthesis Example 1

7.57 g of propylene glycol monomethyl ether and 17.67 g of propylene glycol monomethyl ether acetate were added to 5.00 g of polyether of epoxy group-containing alicyclic hydrocarbon (trade name: EHPE-3150, epoxy value: 179 g/eq., available from Daicel Corporation, Formula (A-14)), 3.11 g of 9-anthracenecarboxylic acid, 2.09 g of benzoic acid, and 0.62 g of ethyltriphenylphosphonium bromide, and the mixture was heated and refluxed under a nitrogen atmosphere for 13 hours. To the obtained polymer solution, 16 g of cation exchange resin (trade name: DOWEX (registered trademark) 550A, Muromachi Technos Co., Ltd.) and 16 g of anion exchange resin (trade name: amberlite (registered trademark) 15JWET, ORGANO CORPORATION) were added, and the mixture was subjected to ion exchange treatment at room temperature for 4 hours. The ion-exchange resins were separated, and a solution of compound was obtained. The obtained compound corresponded to Formula (D-1), and the weight average molecular weight Mw measured by GPC in terms of polystyrene was 4,700.

Formula (D-1)

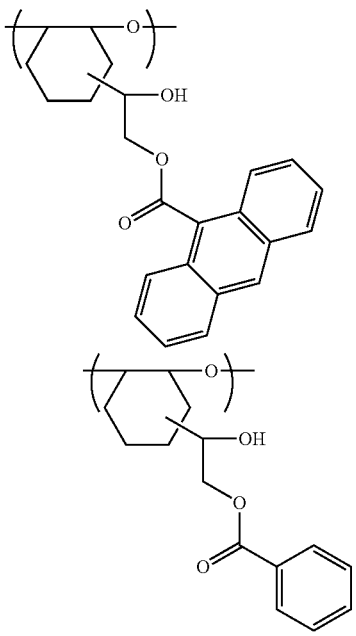

Production Example 1

To 2.61 g of the resin solution (solid content: 26.80% by mass) obtained in Synthesis Example 1, 0.001 g of surfactant (product name: MEGAFACE (trade name) R-40 available from DIC Corporation, fluorosurfactant), 4.60 g of propylene glycol monomethyl ether, and 2.79 g of propylene glycol monomethyl ether acetate were added to prepare a solution of composition for coating a stepped substrate.

Production Example 2

To 2.68 g of the resin solution (solid content: 26.09% by mass) obtained in Synthesis Example 2, 0.001 g of surfactant (product name: MEGAFACE (trade name) R-40 available from DIC Corporation, fluorosurfactant), 4.53 g of propylene glycol monomethyl ether, and 2.79 g of propylene glycol monomethyl ether acetate were added to prepare a solution of composition for coating a stepped substrate.

Production Example 3

To 3.03 g of the resin solution (solid content: 23.11% by mass) obtained in Synthesis Example 3, 0.001 g of surfactant (product name: MEGAFACE (trade name) R-40 available from DIC Corporation, fluorosurfactant), 4.18 g of propylene glycol monomethyl ether, and 2.79 g of propylene glycol monomethyl ether acetate were added to prepare a solution of composition for coating a stepped substrate.

Comparative Production Example 1

To 5.15 g of the resin solution (solid content: 23.17% by mass) obtained in Comparative Synthesis Example 1, 0.30 g of tetramethoxymethyl glycoluril (product name: POWDERLINK (registered trademark) 1174 available from Nihon Cytec Industries Inc.), 0.01 g of pyridinium p-toluenesulfonate, 0.001 g of surfactant (product name: MEGAFACE (trade name) R-40 available from DIC Corporation, fluorosurfactant), 11.76 g of propylene glycol monomethyl ether, and 2.78 g of propylene glycol monomethyl ether acetate were added to prepare a solution of composition for coating a stepped substrate.

[Test of Photocuring Properties]

In Examples 1 to 3, the compositions for coating a stepped substrate prepared in Production Examples 1 to 3, respectively, were each applied to a silicon wafer using a spinner (spin coating). Each silicon wafer was heated on a hot plate at 215° C. for 1 minute to form a coating film with a thickness of 0.20 μm (resist underlayer film). This stepped substrate-coating film was irradiated with ultraviolet light of 500 mJ/cm$^2$ using an ultraviolet light irradiation device manufactured by EYE GRAPHICS CO., LTD. (super-high pressure mercury lamp 1 kW, illuminance at 313 nm: 20.5 mW/cm$^2$). The solvent separation with or without irradiation with ultraviolet light was examined. For the solvent separation, the coated film after irradiation with ultraviolet light was immersed in a mixed solvent of propylene glycol monomethyl ether and a propylene glycol monomethyl ether acetate at a ratio of 7:3 for 1 minute, spin-dried, and baked at 100° C. for 1 minute, and the film thickness was measured.

In Comparative Examples 1 to 3, the compositions for coating a stepped substrate obtained in Production Examples 1 to 3, respectively, were each applied to a silicon wafer through spin coating and heated in the same manner as described above. Irradiation with light was not carried out, and the test of solvent separation was carried out. The results are shown in Table 1. In Table 1, the initial film thickness shows the film thickness before the test of solvent separation.

TABLE 1

|  | Initial film thickness (nm) | Film thickness after separation of solvent |
|---|---|---|
| Example 1 | 195.5 | 194.8 |
| Example 2 | 196.6 | 195.0 |
| Example 3 | 196.6 | 195.0 |
| Comparative Example 1 | 199.9 | 8.3 |
| Comparative Example 2 | 200.4 | 9.0 |
| Comparative Example 3 | 200.1 | 8.8 |

As confirmed from the results, in Examples 1 to 3, curing was not achieved by heating at 215° C. before irradiation with ultraviolet light, but curing was achieved by irradiation with ultraviolet light.

In Examples 4 to 6, the compositions for coating a stepped substrate prepared in Production Examples 1 to 3, respectively, were each applied to a silicon wafer, and heated on a hot plate at 215° C. for 1 minute, to form a stepped substrate-coating film. The refractive index at 193 nm and attenuation coefficient of each of the stepped substrate-coating films were measured. In the measurement of refractive index and attenuation coefficient, an ellipsometer (M2000D) manufactured by J.A. Woollam Japan Corp., was used.

The dry etching rate of the stepped substrate-coating films as Examples 4 to 6 obtained by each applying the compositions for coating a stepped substrate prepared in Production Examples 1 to 3, respectively, to a silicon wafer, followed by heating on a hot plate at 215° C. for 1 minute was compared with that of a resist film obtained from a resist solution (product name: SUMIRESIST PAR855) available from Sumitomo Chemical Co., Ltd.

The ratios (selection ratio of dry etching rate) of the dry etching rates of the stepped substrate-coating films (flattened films) to that of the resist film are shown in Table 2. In measurement of dry etching rate, a dry etching device (RIE-10NR) manufactured by Samco Inc., was used. The dry etching rate using $CF_4$ gas was measured.

The refractive index (n value), attenuation coefficient (k value), and ratio of dry etching rate (selection ratio of dry etching rate) of the stepped substrate-coating films (flattened films) are shown in Table 2.

TABLE 2

|  | Refractive index (n value) | Attenuation coefficient (k value) | Wavelength (nm) | Selection ratio of dry etching rate |
|---|---|---|---|---|
| Example 4 | 1.36 | 0.22 | 193 | 1.10 |
| Example 5 | 1.68 | 0.43 | 193 | 1.04 |
| Example 6 | 1.64 | 0.17 | 193 | 1.10 |

As seen from the results in Table 2, the stepped substrate-coating film (flattened film) obtained from the composition for coating a stepped substrate of the present invention has an appropriate anti-reflective effect. A resist film is applied to an upper layer of the stepped substrate-coating film (flattened film) obtained from the composition for coating a stepped substrate of the present invention, exposed, and developed to form a resist pattern, and the substrate is processed by dry etching through the resist pattern using an etching gas or the like. At that time, substrate processing is possible since the dry etching rate is higher than that of the resist film.

Therefore, the stepped substrate-coating film (flattened film) formed by applying the composition for coating a stepped substrate of the present invention followed by curing can be used as a resist underlayer film that is an under layer of the resist film. Accordingly, the composition for coating a stepped substrate can be used as a resist underlayer film-forming composition.

[Test of Coating Stepped Substrate]

For evaluation of step-coating properties, the coating film thicknesses at a dense pattern area (D-1) with a trench width of 50 nm and a pitch of 100 nm, an open area (OPEN) that was unpatterned, and a large trench area with a trench width of 230 nm (T-1) and 800 nm (T-2) of a $SiO_2$ substrate with a thickness of 200 nm were compared. In Examples 7 to 9, the compositions for coating a stepped substrate prepared in Production Examples 1 to 3, respectively, were each applied to the substrate described above so that the film thickness was 150 nm. The compositions were each baked at 215° C. for 60 seconds, and exposed to light of 500 mJ/cm$^2$ with 313 nm. The step-coating properties were observed by a scanning electron microscope (S-4800) manufactured by Hitachi High-Technologies Corporation, and the difference (Bias/difference in level of coating) between the film thickness at the dense area or the large trench area and the film thickness at the open area was measured. Thus, the flattening properties were evaluated.

In Comparative Example 4, the coating properties of the composition for coating a stepped substrate obtained in Comparative Production Example 1 were evaluated under the same condition.

TABLE 3

|  | D-1/OPEN Difference in level of coating (nm) | T-1/OPEN Difference in level of coating (nm) | T-2/OPEN Difference in level of coating (nm) |
|---|---|---|---|
| Example 7 | 14 nm | 6 nm | 2 nm |
| Example 8 | 28 nm | 12 nm | 6 nm |
| Example 9 | 22 nm | 18 nm | 2 nm |
| Comparative Example 4 | 108 nm | 66 nm | 80 nm |

In the comparison of the coating properties of the stepped substrate, the differences in level of coating between the pattern area and the open area as the results of Examples 7 to 9 are smaller than that as the result of Comparative Example 4. This shows good flattening properties.

INDUSTRIAL APPLICABILITY

The composition for coating a stepped substrate of the present invention can be flatly applied even to a stepped substrate by applying followed by reflow under heating. Since the composition has flowability and the composition can form a flat film without thermal crosslinking during heating, subsequent irradiation with light makes curing under photodimerization possible. Since the curing expresses solvent resistance and the like, a coating film such as a resist can be formed as a top coat on an upper layer of the film. Therefore, a resist underlayer film and the like can be used.

The invention claimed is:

1. A photocurable composition for coating a stepped substrate, the photocurable composition capable of being photocured by light irradiation, the photocurable composition comprising
a compound (C) having in the molecule a partial structure of Formula (1):

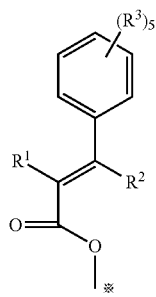

Formula (1)

wherein $R^1$ and $R^2$ are each independently a hydrogen atom, a $C_{1-10}$ alkyl group, or a $C_{6-40}$ aryl group, five $R^3$s are each independently a hydrogen atom, a hydroxy group, a $C_{1-10}$ alkoxy group, a $C_{1-10}$ alkyl group, a nitro group, or a halogen atom, and * is a bond site to the compound, wherein the compound (C) is a reaction product of an epoxy group-containing compound (A) and a cinnamic acid (B) having the partial structure of Formula (1), and
a solvent,
wherein the photocurable composition is free of a thermal crosslinking moiety and an acid catalyst.

2. The photocurable composition for coating a stepped substrate according to claim 1, wherein the compound (C) is the reaction product in which the mole ratio of an epoxy group of the epoxy group-containing compound (A) to the cinnamic acid (B) having the partial structure of formula (1) is 1:1 to 4:1.

3. The photocurable composition for coating a stepped substrate according to claim 1, wherein the epoxy group-containing compound (A) is an epoxy group-containing benzene or epoxy group-containing benzene fused ring compound, an epoxy group-containing aliphatic polyether, an epoxy group-containing novolak polymer, a polyether of epoxy group-containing alicyclic hydrocarbon, or an epoxy group-containing polyester.

4. The photocurable composition for coating a stepped substrate according to claim 1, wherein the composition is capable of forming a resist underlayer film in a lithography process for production of a semiconductor device.

5. A method of producing a coated substrate comprising steps of:
(i) applying the photocurable composition for coating a stepped substrate according to claim 1 to a stepped substrate; and
(ii) exposing the coated substrate to actinic radiation.

6. The method according to claim 5, wherein the step (i) further includes a step (ia) of heating the coated substrate at a temperature of 70 to 400° C. for 10 seconds to 5 minutes after applying the photocurable composition for coating a stepped substrate to the substrate.

7. The method according to claim 5, wherein the actinic radiation in the step (ii) has a wavelength of 250 nm to 350 nm.

8. The method according to claim 5, wherein the exposure dose in the step (ii) is 500 mJ/cm² to 1,500 mJ/cm².

9. The method according to claim 5, wherein the stepped substrate has an open area (unpatterned area) and a pattern area of DENSE (dense) and ISO (coarse), and the aspect ratio of the pattern is 0.1 to 10.

10. The method according to claim 5, wherein the coated substrate to be produced has a bias (difference in level of coating) between the open area and the pattern area of 1 to 50 nm.

11. A method of producing a semiconductor device comprising steps of:
forming an underlayer film on a stepped substrate from the photocurable composition for coating a stepped substrate according to claim 1;
forming a resist film on the underlayer film;
forming a resist pattern by irradiation with light or an electron beam and development;
etching the underlayer film through the formed resist pattern; and
processing a semiconductor substrate using the patterned underlayer film.

12. The method according to claim 11, wherein the stepped substrate has an open area (unpatterned area) and a pattern area of DENSE (dense) and ISO (coarse), and the aspect ratio of the pattern is 0.1 to 10.

13. The method according to claim 11, wherein the step of forming an underlayer film from the photocurable composition for coating a stepped substrate includes steps of:
(i) applying the photocurable composition for coating a stepped substrate according to claim 1 to the stepped substrate; and
(ii) exposing the coated substrate to actinic radiation.

14. The method according to claim 13, wherein the step (i) further includes a step (ia) of heating the coated substrate at a temperature of 70 to 400° C. for 10 seconds to 5 minutes after applying the photocurable composition for coating a stepped substrate to the substrate.

15. The method according to claim 13, wherein the actinic radiation in the step (ii) has a wavelength of 250 nm to 350 nm.

16. The method according to claim 13, wherein the exposure dose in the step (ii) is 500 mJ/cm² to 1,500 mJ/cm².

17. The method according to claim 11, wherein the underlayer film formed from the photocurable composition for coating a stepped substrate has a bias between the open area and the pattern area of 1 to 50 nm.

18. A method of producing a semiconductor device comprising steps of:
forming an underlayer film on a stepped substrate from the photocurable composition for coating a stepped substrate according to claim 1;
forming a hard mask on the underlayer film;
forming a resist film on the hard mask;
forming a resist pattern by irradiation with light or an electron beam and development;
etching the hard mask through the formed resist pattern;
etching the underlayer film through the patterned hard mask; and
processing a semiconductor substrate through the patterned underlayer film.

19. The method according to claim 18, wherein the stepped substrate has an open area (unpatterned area) and a pattern area of DENSE (dense) and ISO (coarse), and the aspect ratio of the pattern is 0.1 to 10.

20. The method according to claim 18, wherein the step of forming an underlayer film from the photocurable composition for coating a stepped substrate includes steps of:
  (i) applying the photocurable composition for coating a stepped substrate according to claim 1 to the stepped substrate; and
  (ii) exposing the coated substrate to actinic radiation.

21. The method according to claim 20, wherein the step (i) further includes a step (ia) of heating the coated substrate at a temperature of 70 to 400° C. for 10 seconds to 5 minutes after applying the composition for coating a stepped substrate to the substrate.

22. The method according to claim 20, wherein the actinic radiation in the step (ii) has a wavelength of 250 nm to 350 nm.

23. The method according to claim 20, wherein the exposure dose in the step (ii) is 500 mJ/cm² to 1,500 mJ/cm².

24. The method according to claim 18, wherein the underlayer film formed from the photocurable composition for coating a stepped substrate has a bias between the open area and the pattern area of 1 to 50 nm.

\* \* \* \* \*